United States Patent [19]

McIntyre

[11] Patent Number: 5,619,449
[45] Date of Patent: Apr. 8, 1997

[54] BIT LINE SENSING IN A MEMORY ARRAY

[75] Inventor: David H. McIntyre, Bishopston, United Kingdom

[73] Assignee: SGS-Thomson Microelectronics Limited, Almondsbury Bristol, United Kingdom

[21] Appl. No.: 559,695

[22] Filed: Nov. 15, 1995

[30] Foreign Application Priority Data

Nov. 15, 1994 [GB] United Kingdom .................. 9423032

[51] Int. Cl.$^6$ ................................................. G11C 16/04
[52] U.S. Cl. ..................................... 365/185.21; 365/208
[58] Field of Search ...................... 365/185.21, 185.11, 365/205, 207, 208

[56] References Cited

U.S. PATENT DOCUMENTS

| | | | |
|---|---|---|---|
| 4,970,691 | 11/1990 | Atsumi | 365/185.21 |
| 5,029,138 | 7/1991 | Iwashita | 365/185.21 |
| 5,237,530 | 8/1993 | Takashina | 365/185.21 |
| 5,237,534 | 8/1993 | Tanaka | 365/185.21 |
| 5,331,597 | 7/1994 | Tanaka | 365/185.21 |
| 5,440,506 | 8/1995 | Longway | 365/207 |
| 5,487,045 | 1/1996 | Trodden | 365/205 |

FOREIGN PATENT DOCUMENTS

| | | | |
|---|---|---|---|
| 0130129 | 1/1985 | European Pat. Off. | G11C 17/00 |
| 0175102 | 3/1986 | European Pat. Off. | G11C 17/00 |

OTHER PUBLICATIONS

Standard Search Report filed in the European Patent Office on Feb. 3, 1995.

*Primary Examiner*—David C. Nelms
*Assistant Examiner*—Son Mai
*Attorney, Agent, or Firm*—David M. Driscoll; James H. Morris

[57] ABSTRACT

A memory comprises first and second arrays of memory cells organised in rows and column. The cells in each row are connected to respective wordlines and the cells in each column are connected to a respective bit line. Wordlines of the first array are addressable independently of the wordlines of the second array. A sense amplifier is provided to sense the differential between a signal on the bit line of a selected cell in one array and a reference signal. A current souce is selectively connectable to supply the reference signal for comparison with the signal on the bit line of the addressed array. The present invention allows capacitive balancing to be achieved without the need for dummy cells.

12 Claims, 5 Drawing Sheets

FIG. 3

| | SELECTED CELL | | | UNSELECTED CELL SAME ROW | | | UNSELECTED CELL SAME COLUMN | | |
|---|---|---|---|---|---|---|---|---|---|
| | DRAIN VOLTAGE | GATE VOLTAGE | SOURCE VOLTAGE | DRAIN VOLTAGE | GATE VOLTAGE | SOURCE VOLTAGE | DRAIN VOLTAGE | GATE VOLTAGE | SOURCE VOLTAGE |
| PROGRAM | ~5V | $V_{PP}$ | $V_{GND}$ | $V_{GND}$ | $V_{PP}$ | $V_{GND}$ | ~5V | $V_{GND}$ | $V_{GND}$ |
| ERASE* | FLOATING | $V_{GND}$ | $V_{PP}$ | FLOATING | $V_{GND}$ | $V_{PP}$ | FLOATING | $V_{GND}$ | $V_{PP}$ |
| READ | BIASED TO ~1V | ~5V | $V_{GND}$ | $V_{GND}$ | ~5V | $V_{GND}$ | BIASED TO ~1V | $V_{GND}$ | $V_{GND}$ |

* ALL CELLS SELECTED IN ERASE

BIT LINE SENSING IN A MEMORY ARRAY

FIELD OF THE INVENTION

This invention relates to bit line sensing in a memory array comprising a plurality of memory cells arranged in rows and columns.

BACKGROUND TO THE INVENTION

The present invention can be applied to any appropriate memory structure wherein each column comprises a plurality of memory cells connected to a single bit line, and is not restricted to any specific structure of memory cell. However, the invention has particular advantage in an electrically erasable flash memory having single transistor cells with a floating gate. It is desirable to use a dynamic sense amplifier for sensing data from memory cells in a flash memory. However, as is known, a sense amplifier in a flash memory compares a reference current with a current on the bit line connected to an addressed memory cell.

The reference current I REF supplied to the sense amplifier can be taken from any convenient source on chip. However, there is a problem if the capacitance associated with the source for the reference current I REF differs significantly from the capacitance of the bit line to which the selected cell is connected. Capacitive balancing is needed for good sensing. However, this is not simple to achieve in a single transistor flash EPROM. As each cell contains only one transistor, it is not possible to use a folded bit line scheme as is implemented commonly on dynamic random access memories (DRAMs). Furthermore, although in principle a dummy bit line could be used in association with each active bit line per column, this would increase the required space in the layout and make the chip much larger. The difficulty of achieving proper capacitive balancing in a single transistor flash EPROM has meant that the sense amplifier has conventionally been a static sense amplifier, for which the output will eventually settle at the correct state even after initial noise. For the reasons given above, it has not been possible to use a dynamic sense amplifier on a single transistor flash EPROM, because these amplifiers are particularly sensitive to initial noise, which could cause the dynamic sense amplifier to latch in an incorrect state.

SUMMARY OF THE INVENTION

According to the present invention there is provided a memory comprising:

first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array so that when a cell is selected in an addressed one of the first and second arrays a cell in a corresponding column in the other array is not;

at least one sense amplifier having first and second input nodes and connected to sense the differential between a signal on the bit line of the selected cell of the first array and a reference signal; and a current source selectively connectable to said first and second input nodes to supply said reference signal to one of said first and second nodes connected to the bit line of the non-addressed array for comparison with the signal on the corresponding bit line of the addressed array connected to the other of said first and second nodes.

In a simple embodiment, the arrangement is such that when any column in one of the arrays is selected, no column in the other array can be selected.

In the described embodiment, each of the first and second arrays has associated with it column select circuitry for selectively connecting bit lines to the sense amplifier.

In a preferred embodiment, the rows extend horizontally and the columns extend vertically, the first and second arrays being located vertically with respect to one another mirrored about a horizontal axis and with said sense amplifier located between said arrays. Other topographical layouts are possible.

The arrangement according to the invention is particularly enhanced where the sense amplifier is a dynamic sense amplifier, either a dynamic voltage sensing amplifier or a dynamic current sensing amplifier. However, the memory structure defined above also assists in improving noise immunity where the sense amplifier is a static sense amplifier. The value of the current supplied by the current source is set to be less than that drawn by an erased cell in the array but more than that drawn by a programmed cell. For the flash memory cell described above, the programmed cell takes no current, so that in the described implementation, the current supplied by the current source is set at approximately half that of an erased cell.

The current source can be a memory cell elsewhere in the memory array which is kept specially for this purpose, or a circuit which derives a current source from such a cell, e.g. by mirroring.

The invention also provides a method of sensing in a memory comprising first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array, the method comprising the steps of:

addressing a cell in one of the first and second arrays while the other of the first and second arrays is not addressed, connecting to a first node of a sense amplifier the bit line connected to the addressed cell in the addressed array and to a second node of the sense amplifier a corresponding bit line of the non-addressed array, and supplying a current to the second node of the non-addressed array to act as a reference current for sensing.

For a better understanding of the present invention and to show how the same may be carried into effect, reference will now be made by way of example to the accompanying drawings.

BRIEF DESCRIPTION OF THE DRAWINGS

FIG. 3 illustrates in tabular form the signals applied to various cells within the flash memory array during operation;

DESCRIPTION OF THE PREFERRED EMBODIMENTS

Figure 1:
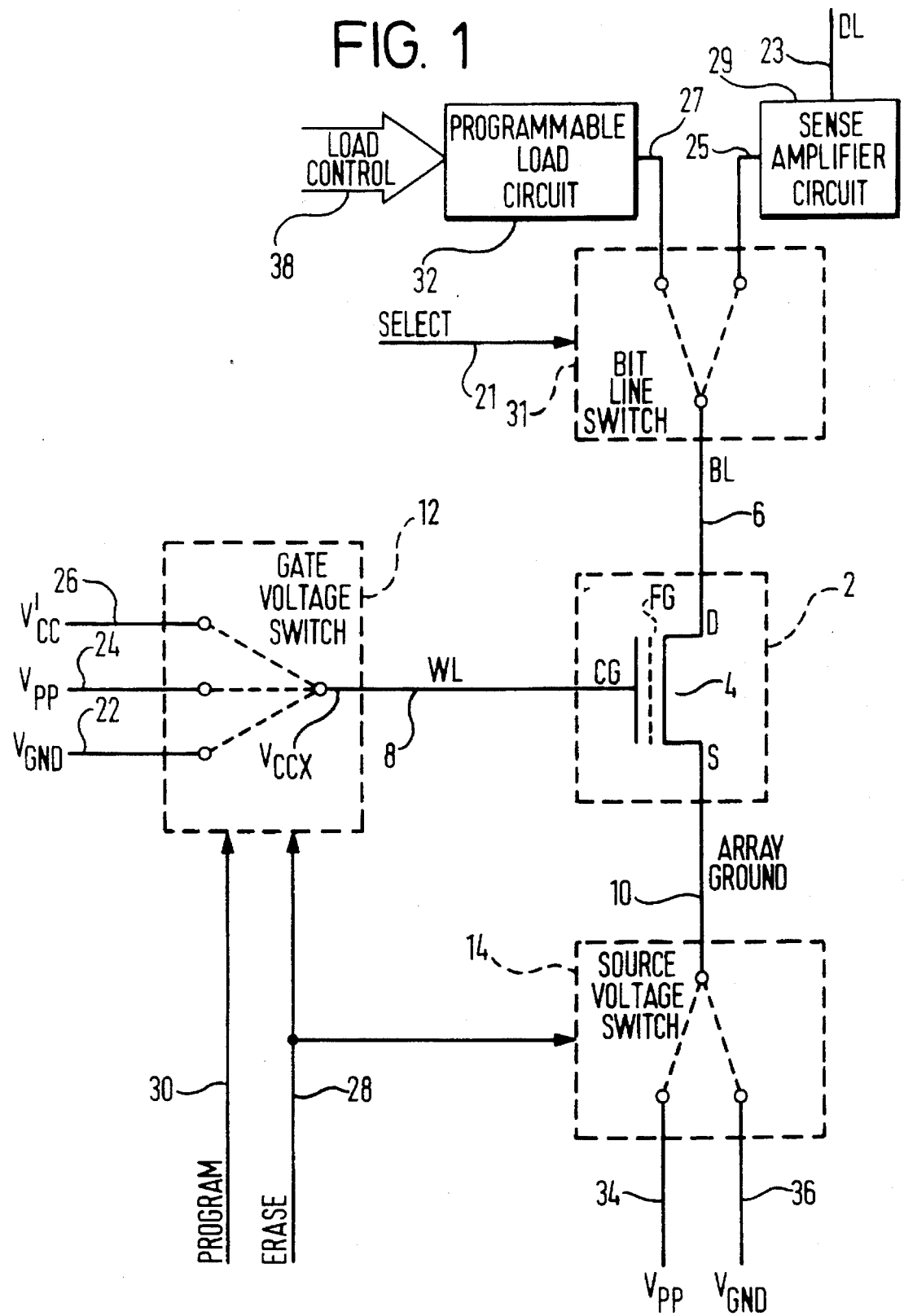
FIG. 1 is an illustrative example of a basic flash memory cell showing the different signal levels which can be applied to the cell.

FIG. 1 illustrates a flash memory cell 2 comprising a single floating gate transistor 4 having a control gate CG, a floating gate FG, a source S, and a drain D. The source S of the floating gate transistor 4 is connected to an ARRAY GROUND signal on line 10. Through a source voltage switch circuit 14 this line 10 can be at a ground voltage VGND or a high voltage Vpp. Voltage Vpp represents a programming potential (typically 12 V) and voltage VGND represents device ground. Vpp is normally connected to array ground via a resistor (not shown). The source voltage switch 14 is connected to the voltage Vpp via line 34 and the voltage VGND via line 36. The control gate CG of the floating gate transistor 4 is connected to a gate voltage switch (WL) 8. The gate voltage switch 12 is further connected to voltages V'cc, Vpp and VGND on lines 26, 24 and 22 respectively. V'cc is at 5 V for a 5 V part or is boosted to about 5 V (or at least above 4 V) for a 3 V part. These switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch is further connected to the input of a programmable load circuit 32 on write line 27 and the input of a sense amplifier circuit 29 on read line 25. It will be appreciated that in an array a plurality b of selected bit lines may simultaneously be connected to the sense amplifier circuit so that line 25 will be normally implemented as b lines. In the described embodiment b=8. The switch 31 receives a control signal SELECT on line 21. The programmable load circuit 32 receives load control signals on lines 38.

The flash memory has three modes of operation: program, erase and read. Each of these modes will be described hereinafter with reference to FIG. 1. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e. contains either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The control signal SELECT on line 21 is set such that the bit line on line 6 is connected to the programmable load 32 by line 27. The load control signals 38 are set such that the programmable load 32 is controlled such that a voltage of about 5 V is on the drain D of the transistor 4 via the bit line 6. As a result of these signals applied to the transistor 4 the floating gate FG becomes negatively charged. The negative charge shifts the threshold voltage of the floating gate transistor making it less conductive. The amount of negative charge accumulated at the floating gate depends on the duration for which the control signal PROGRAM is set. In this way, a "0" is written into the cell. Normally, several program pulses are needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The control signal SELECT on line 21 is again set such that the bit line 6 is disconnected so that it floats. As the floating gate transistor is fabricated such that the source region in the substrate underlies the floating gate, any negative charge on the floating gate will be reduced. The amount of negative charge removed from the floating gate FG depends on the duration for which the ERASE signal on line 28 is set. The reduction of negative charge shifts the threshold voltage of the floating gate transistor making it more conductive. In this way the state of the cell is restored to "1". Normally, several erase pulses are required, each erase pulse being followed by a verify cycle.

During a read mode, neither the control signal ERASE on line 28 nor the control signal PROGRAM on line 30 are set. Consequently, the V'cc signal on line 26 is connected by the source voltage switch 12 to the control gate of the transistor 4 via the word line 8 and the voltage VGND on line 36 is connected to the source of the transistor 4 via the ARRAY GROUND signal line 10. The bit line 6 is biased to approximately 1 volt prior to a read operation by a bit line load (discussed later) within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell. The current passed (or not) by the cell is compared with a reference current to detect the status of the cell, as described in more detail in the following.

The operation of a flash cell in a memory array will now be described with reference to FIG. 2. Signal lines or circuitry common to FIG. 1 can be identified in FIG. 2 by use of the same reference numerals. Voltage supplies have not been illustrated in FIG. 2 for reasons of clarity, but it will be understood with reference to FIG. 1 which voltages are required in various parts of the circuit.

Figure 2:
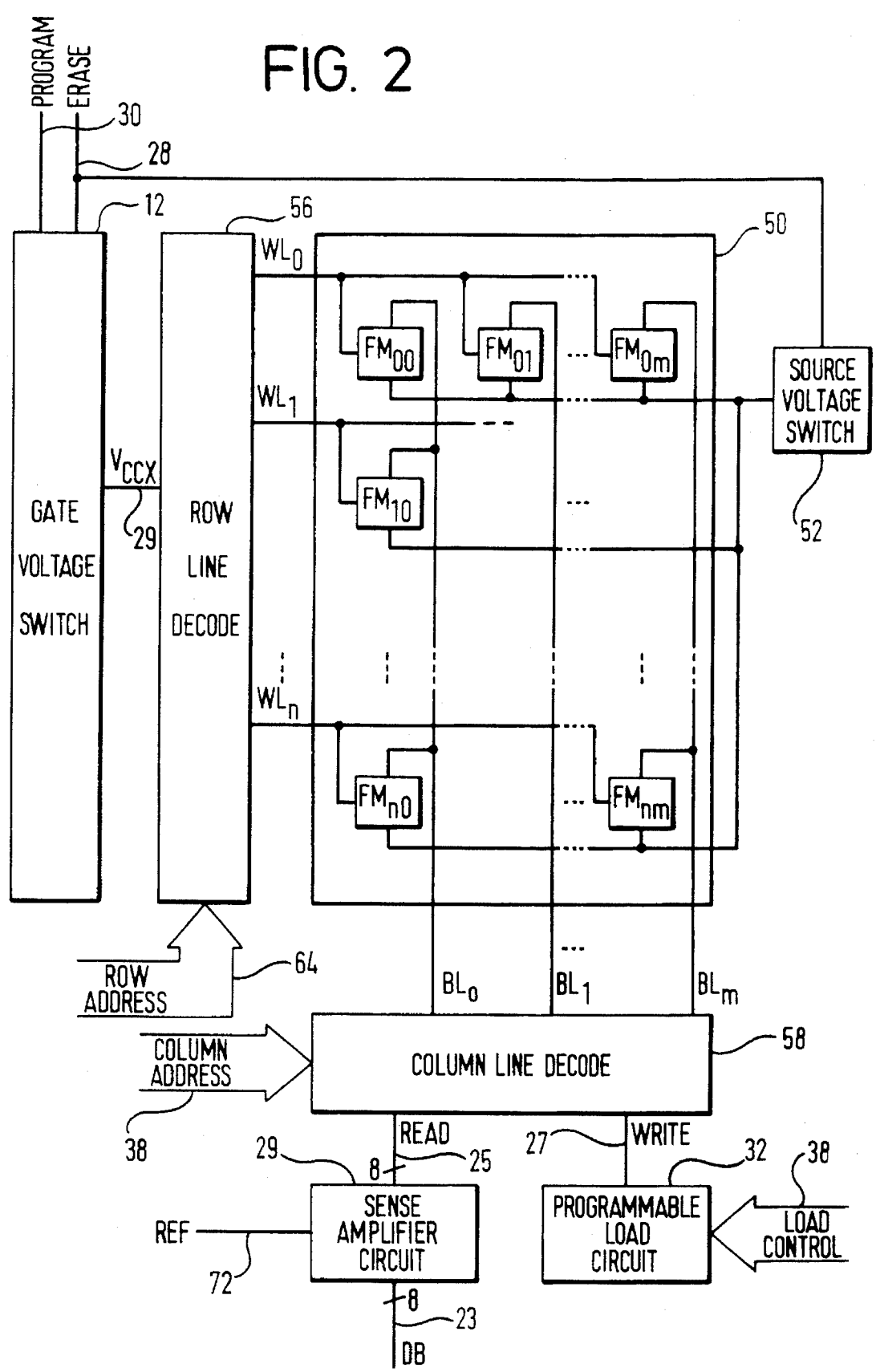
FIG. 2 is an illustrative block diagram of the overall structure of a flash memory array.

FIG. 2 illustrates a flash memory array 50 comprising a plurality of flash memory cells FMoo . . . FMnm, arranged in rows and columns, each of which can be the same as the cell 2 shown in FIG. 1. The gates of the transistors in each memory cell in a row are commonly connected to a respective word line WLo . . . WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 29 to be switched to the addressed wordline through the row decode circuit 56.

The drains of each transistor in a column are commonly connected by bit lines BLo . . . BLm to a column line decode circuit 58. The column line decode circuit can be considered as a plurality m of the bit line switch circuits 31, with the SELECT signal being generated responsive to the column address 38. The output of the column line decode circuit 58 on line 25 is a read output and is connected to the sense amplifier circuit 29. The sense amplifier circuit 29 contains a plurality of sense amplifiers (eight in the described embodiment to allow eight bits to be read in a common cycle), and hence the output on line 25 is actually a plurality of bits wide (eight in the described example). The column line decode circuit receives a write input on line 27 from the programmable load circuit 32. The programmable load circuit is controlled by the load control signals 38. During a program or erase operation the bit lines BLo to BLm are selectively connected to the programmable load circuit 32. During a read operation the selected bit line (or bit lines) are connected to the sense amplifier circuit 29. The sense amplifier circuit 29 also receives a reference signal REF on line 72 and generates output signals on the data bus (DB) 23, which is an eight bit bus in the described embodiment.

It will be appreciated that when a particular cell is chosen to be programmed, the programming load will only be applied to a selected column so that other cells in the same row as the selected cell are not inadvertently programmed. In addition in general during read and program operations it is desirable to apply certain signals to cells in the array which have not been selected to improve the performance of the cell, as is well known in the art. These signals are summarised in FIG. 3. During an erase operation every cell in the memory array is erased, although it will be appreciated by a person skilled in the art that an array could be split into sectors for erasing so that only part of the array is erased at any one time.

When the sense amplifier circuit 29 is a current sensing sense amplifier, the reference signal REF on line 72 will be a current reference signal. However, there is a problem if the capacitance on the sensing and reference input nodes to the sense amplifier differs significantly, since capacitive balancing is needed for good sensing. However, this is not simple to achieve in a single transistor flash EPROM. As each cell contains only one transistor, it is not possible to use a folded bit line scheme as is implemented commonly on dynamic random access memories (DRAMs). Furthermore, although in principle a dummy bit line could be used in association with each active bit line per column, this would increase the required space in the layout and make the chip much larger. The difficulty of achieving proper capacitive balancing in a single transistor flash EPROM has meant that the sense amplifier has conventionally been a static sense amplifier, for which the output will eventually settle at the correct state even after initial noise. For the reasons given above, it has not been possible to use a dynamic sense amplifier on a single transistor flash EPROM, because these amplifiers are particularly sensitive to initial noise, which could cause the dynamic sense amplifier to latch in an incorrect state.

Figure 4:
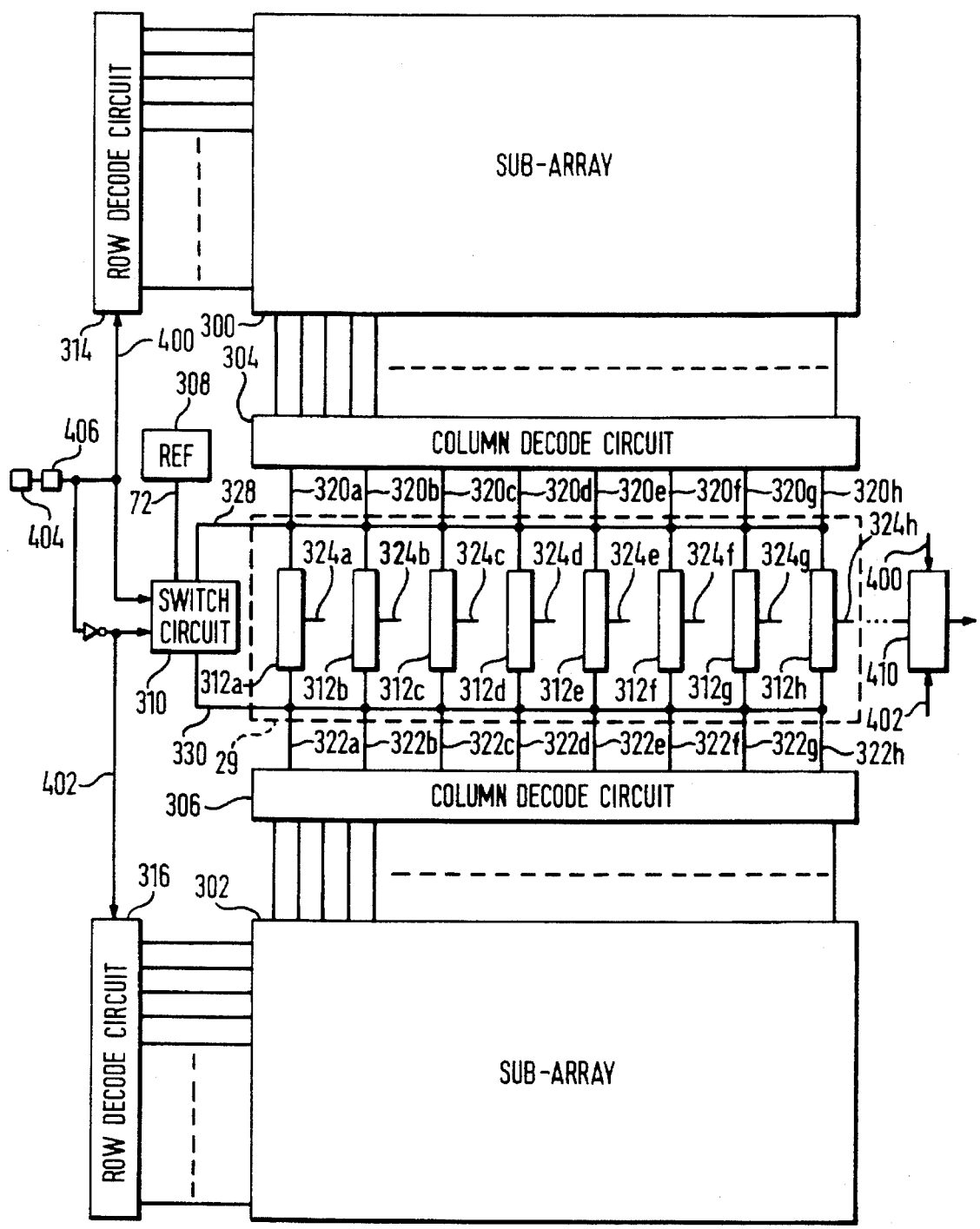
FIG. 4 is a schematic diagram of the overall structure of a flash memory array implementing the present invention.

FIG. 4 illustrates diagrammatically part of a memory structure which allows a capacitive match to be made for sensing. The memory of FIG. 4 has two sub-arrays, a first sub-array 300 and a second sub-array 302. Each of the sub-arrays may be similar to the array 50 of FIG. 2, having n rows and m columns. The gate voltage switch 12, source voltage switch 52 and programmable load circuit 32 of FIG. 2 have been omitted from FIG. 4 for reasons of clarity.

The first sub-array 300 has an associated first row decode circuit 314 and an associated first column decode circuit 304. The second sub-array 302 has an associated second row decode circuit 316 and an associated second column decode circuit 306. The respective row decode circuits drive the n wordlines of the respective arrays. The addressing and control circuitry for the row decode circuits is not shown for reasons of clarity, except to illustrate sub-array select signals on lines 400 and 402 supplied to row decode circuits 314,316 respectively. These signals are derived from an array select pad 404 via a buffer 406. Signal 402 is an inverted version of signal 400 so that only one of the sub-arrays is selected at once. The respective column decode circuits receive the m column lines of the respective arrays. Similarly, the addressing and control circuitry for the column decode circuits is not shown for reasons of clarity. The memory structure also comprises a sense amplifier circuit 29 containing eight sense amplifiers 312a to 312h, a switch circuit 310, and a reference circuit 308. Each sense amplifier 312a to 312h receives an input from a respective one of a first set of read lines 320a to 320h from the first column decode circuit 304, and an input from a respective one of a second set of read lines 322a to 322h from the second column decode circuit 306. Each sense amplifier 312a to 312h generates an output on a respective data line 324a to 324h. The switch circuit 310 receives as an input the reference signal REF on line 72 from the reference circuit 308. The switch circuit 310 selectively connects a reference signal REF to generate a reference current for sensing on a first output line 328 which is connected to each of the first set of read lines 320a to 320h, or to generate a reference current for sensing on a second output line 330 which is connected to each of the second set of read lines 322a to 322h.

In FIG. 4, a single switch circuit is shown for the sake of clarity. However, in a practical implementation each sense amplifier 312a to 312h will include a switching circuit selectively connecting one or other input of the sense circuit to a reference current derived from the reference signal. This is shown more clearly in FIG. 5.

Each array 300 and 302 is an active array, not a "dummy" array, i.e. each array contains addressable memory cells storing data bits. However, the row decode circuits 314 and 316 are independently addressable so that when a wordline in the first array 300 is selected, no wordline in the second array 302 is selected.

The column decode circuits 304 and 306 can be commonly addressed so as to connect the sense amplifiers 312a to 312h to the bit lines associated with the addressed memory cells in one of the first and second arrays 300 and 302 and the corresponding bit lines (on which no cells can be addressed) in the other of the first and second arrays 300 and 302. The column decode circuit 304 connects eight of the m bit lines of the first array 300 to the read lines 320a to 320h, and the column decode circuit connects the corresponding eight of the m bit lines of the second array 302 to the read lines 322a to 322h. The "corresponding bit line" in this context means the bit line which is vertically below (or above, as the case may be) the bit line connected to the addressed memory cell. Other layouts are possible provided that bit lines are "paired" between the two arrays, so that when a cell connected to one bit line of such a pair is addressed, it is not possible to address any cells associated with the other bit line of the same pair.

For programming purposes, the column decode circuits can be individually selectable so that only one of the column decode circuits connects the programming voltage to cells of the addressed array. This means that the cells of the non-addressed array for programming are not unnecessarily stressed.

As explained above, each sense amplifier compares the signal on the bit line of the addressed cell with a reference current derived from the reference signal REF from the reference circuit 308.

If a memory cell in the first array 300 is addressed the cells connected to the corresponding bit line of the second array, which is connected through the column decode circuit 306 to the same sense amplifier as is connected to the bit line of the addressed cell provide a perfect capacitive match for sensing. The reference circuit 308 is connected via the switch 310 (or a local switch in each sense amplifier) to provide the reference current derived from the reference signal REF on line 72 to the corresponding bit line in the second array 302, that is the bit line on which no cells have been addressed.

It should be apparent from the above description that only one of the two arrays has a wordline activated although the column decode circuits 304 and 306 associated with each array are activated. The current sensed from the addressed cell depends on whether it is erased or programmed. If the cell is erased, a current flows, while if it is programmed no current flows. No current flows in the corresponding bit line because no wordline is selected (all are grounded).

The reference circuit 308 preferably generates as the reference signal REF on line 72 a constant voltage which can be used to generate a reference current on all eight selected bit lines in the non-selected array. Control of the switch 310 is derived from one address bit stored elsewhere in the memory which can be the same bit which selects one of the two arrays 300 or 302. The reference signal REF can be derived from a memory cell specially kept for this purpose, and the current is set to be less than that drawn by an erased cell in the array, but more than that drawn by a programmed cell (zero in the present implementation). In the preferred embodiment, the reference current is set at half that taken by an erased cell. Details of a suitable reference circuit are given in our copending application No. USSN 08/558,319 filed Nov. 15, 1995.

As can be seen, in the above arrangement the capacitance associated with the respective two inputs of the sense amplifiers 312a to 312h is balanced, because there are an equal number of memory cells attached to each bit line. Therefore, depending on whether the addressed cell in the addressed array is programmed or erased, the difference in the currents drawn from the two inputs of the sense amplifier will cause a small voltage difference which can be sensed by the sense amplifer. Any on-chip noise (for example due to coupling within the column decode circuitry) will affect both bit lines equally. As the sense amplifier is relying on differential sensing, this noise will be ignored giving reliable sensing.

The arrangement could be such that there is merely a restriction such that when a particular cell on a particular column is addressed in array 1, for example, it is not possible to address a cell in the same column in array 2, but it is possible to address a cell in a different column.

The circuit of FIG. 4 also includes a flip circuit 410 for selectively inverting the data read from the sense amplifiers 312a–12h. It will be apparent that there will be a difference in the sense of the sensed data when it is derived from the first sub-array 300 and the second sub-array 302. When the first sub-array 300 is selected, the sense amplifiers compare the current on the selected bit line with the reference signal from reference circuit 308 and provide a one or a zero on line 324 depending on which is greater. In this case, the current from the bit line is presented at the upper terminal of the sense amplifier 312 and the reference current is presented at the lower input terminal of the sense amplifier 312. However, when the second sub-array 302 is selected, the reference signal is connected to the upper input terminal of the sense amplifier 312 and the signal from the selected bit line is connected to the lower input terminal of the sense amplifier 312. Therefore, the sense of the data bit output on line 324 is inverted relative to the case when the first sub-array 300 is selected. The flip circuit 410 is thus activated when the second sub-array 302 is active to invert the data bit on line 324 before it is output from the memory. Activation of the flip circuit 410 is carried out responsive to the sub-array select signals 400,402.

Figure 5:
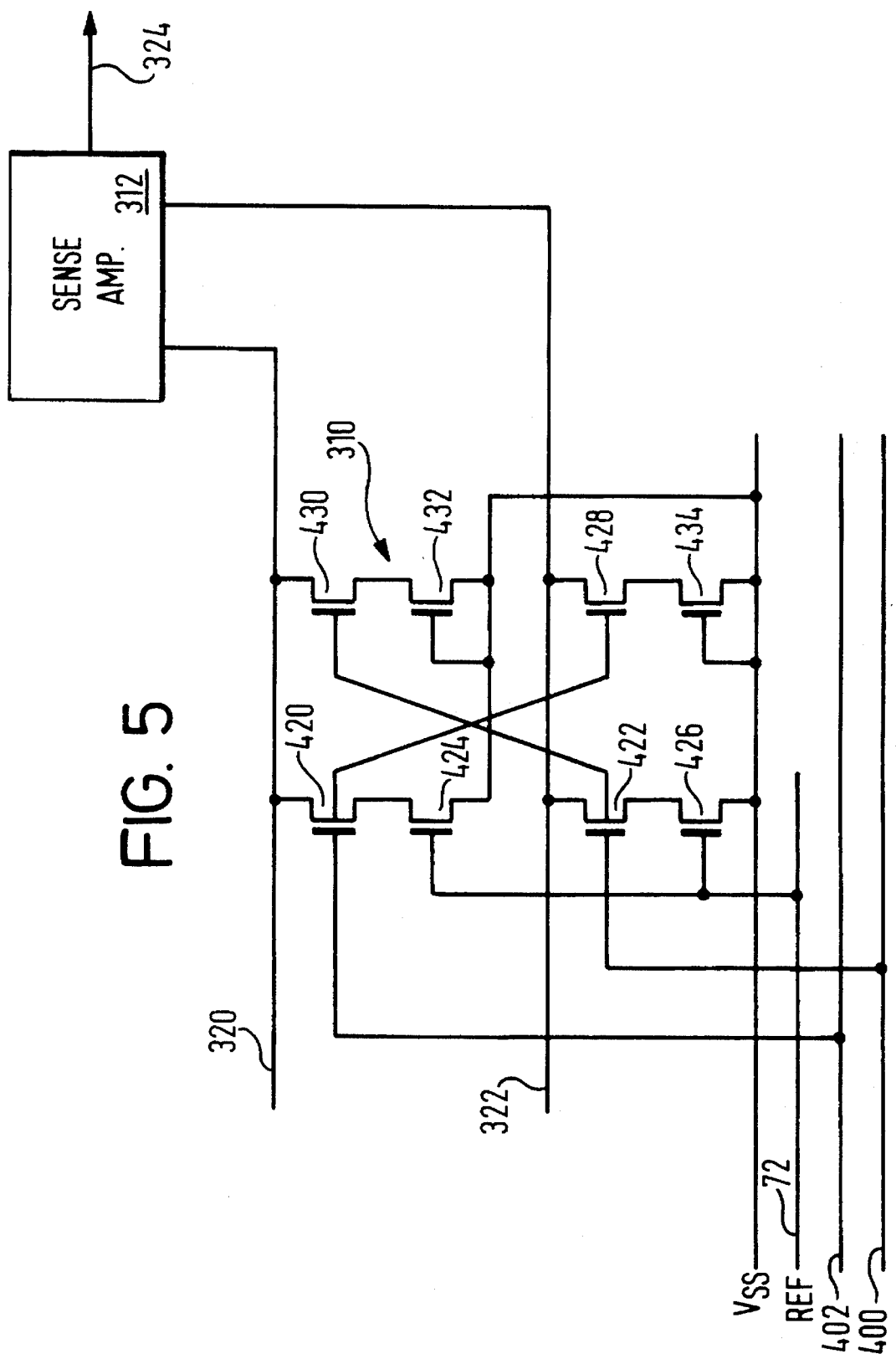
FIG. 5 is a diagram of one embodiment of a switch circuit.

Reference will now be made to FIG. 5 to describe one embodiment of a switch circuit which is local to each sense amplifier. The switch circuit comprises first and second select transistors 420,422 for receiving respectively the sub-array select signals 400,402. The switch circuit also comprises control transistors 424,426 which are controlled by the reference signal on line 72. The switch circuit also contains corresponding balancing transistors including select balancing transistors 428,430 receiving respectively the array select signals 400,402 and balancing control transistors 432,434. Select transistor 420 and control transistor 424 are connected in series between the selected read line 320 and a reference voltage Vss. The select transistor 422 and control transistor 426 are similarly connected in series between the selected read line of the second sub-array 322 and the reference voltage Vss. It can readily be seen from FIG. 5 that with the array select signal 400 active for the first sub-array 300 the select transistor 420 is off and the select transistor 422 is on. Thus, the read line 320 supplies the current from the selected cell directly to the input of the sense amplifier. In contrast, there is a current path for the read line 322 created by select transistor 422 and control transistor 426. The magnitude of the reference current for sensing on this current path depends on the reference signal on line 72.

What is claimed is:

1. A memory comprising:

first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array so that when a cell is selected in an addressed one of the first and second arrays a cell in a corresponding column in the other array is not:

at least one sense amplifier having first and second input nodes respectively for connection to corresponding bit lines of the first and second arrays of memory cells to sense the difference between a signal on a selected one of said bit lines and a reference signal; and a reference generating circuit to generate said reference signal on one of said first and second nodes connected to the bit line of the non-addressed array for comparison with the signal on the corresponding bit line of the addressed array connected to the other of said first and second nodes, said reference generating circuit being responsive to a current control signal to generate said reference signal at a magnitude dependent on the value of the current control signal.

2. A memory as claimed in claim 1 wherein each of the first and second arrays has associated with it column select circuitry for selectively connecting bit lines to the sense amplifier.

3. A memory as claimed in claim 1 or 2 wherein the rows extend horizontally and the columns extend vertically, the first and second arrays being located vertically with respect to one another and with said sense amplifier located between said arrays.

4. A memory as claimed in claim 1 or 2 wherein the sense amplifier is a dynamic sense amplifier.

5. A memory comprising:

first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array so that when a cell is selected in an addressed one of the first and second arrays a cell in a corresponding column in the other array is not;

at least one sense amplifier having first and second input nodes respectively for connection to corresponding bit lines of the first and second array to sense the difference between a signal on a selected one of said bit lines and a reference signal; and a reference generating circuit to generate said reference signal on one of said first and second nodes connected to the bit line of the non-addressed array for comparison with the signal on the corresponding bit line of the addressed array connected to the other of said first and second nodes, wherein the value of the current supplied by the current source is set to be less than that drawn by an erased cell in the array but more than that drawn by a programmed cell.

6. A memory comprising:

first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array so that when a cell is selected in an addressed one of the first and second arrays a cell in a corresponding column in the other array is not;

at least one sense amplifier having first and second input nodes respectively for connection to corresponding bit lines of the first and second array to sense the difference between a signal on a selected one of said bit lines and a reference signal; and a reference generating circuit to generate said reference signal on the one of said first and second nodes connected to the bit line of the non-addressed array for comparison with the signal on the corresponding bit line of the addressed array connected to the other of said first and second nodes, wherein a memory cell elsewhere in the memory array is designated as a current source for supplying said current control signal.

7. A memory as claimed in claim 1 wherein each memory cell comprises a single transistor with a floating gate which is electrically erasable.

8. A memory comprising:

first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array so that when a cell is selected in an addressed one of the first and second arrays a cell in a corresponding column in the other array is not;

at least one sense amplifier having first and second input nodes respectively for connection to corresponding bit lines of the first and second array to sense the difference between a signal on a selected one of said bit lines and a reference signal;

a reference generating circuit to generate said reference signal on the one of said first and second nodes connected to the bit line of the non-addressed array for comparison with the signal on the corresponding bit line of the addressed array connected to the other of said first and second nodes; and a circuit for selectively inverting an output of the sense amplifier.

9. A memory as claimed in claim 2 which is operable in a programming mode wherein said column select circuit comprises first and second column decode circuits associated respectively with said first and second arrays and which are individually selectable.

10. A method of sensing in a memory comprising first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array, the method comprising the steps of:

addressing a cell in one of the first and second arrays while the other of the first and second arrays is not addressed, connecting to a first node of a sense amplifier the bit line connected to the addressed cell in the addressed array and to a second node of the sense amplifier a corresponding bit line of the non-addressed array, and applying a current to the second node of the non-addressed array to act as a reference current for sensing, wherein the value of the current applied to the second node is set to be less than that drawn by an erased cell in the array but more than that drawn by a programmed cell.

11. A method of sensing in a memory comprising first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array, the method comprising the steps of:

addressing a cell in one of the first and second arrays while the other of the first and second arrays is not addressed, connecting to a first node of a sense amplifier the bit line connected to the addressed cell in the addressed array and to a second node of the sense amplifier a corresponding bit line of the non-addressed array, and supplying a current to the second node of the non-addressed array to act as a reference current for sensing, wherein an output of the sense amplifier is selectively inverted.

12. A memory comprising:

first and second arrays of memory cells, each array comprising a plurality of rows of memory cells, the cells in each row being connected to a respective one of a plurality of wordlines and a plurality of columns, the cells in each column being connected to a respective one of a plurality of bit lines, wherein the wordlines of the first array are addressable independently of the wordlines of the second array so that when a cell is selected in an addressed one of the first and second arrays, a cell in a corresponding column in the other array is not;

sensing means having first and second input nodes, respectively for connection to corresponding bit lines of the first and second arrays for sensing the difference between a signal on a selected one of said bit lines and a reference signal; and a current supply means for supplying said reference signal on one of said first and second nodes connected to the bit line of the non-addressed array for comparison with the signal on the corresponding bit line of the addressed array connected to the other of the first and second nodes, said current supply means being responsive to a current control signal to generate said reference signal at a magnitude dependent on the value of the current control signal.

* * * * *